United States Patent [19]

Kuwano

[11] Patent Number: 4,901,132
[45] Date of Patent: Feb. 13, 1990

[54] SEMICONDUCTOR INTEGRATED CIRCUIT WITH SWITCHING BIPOLAR TRANSISTORS HAVING HIGH WITHSTAND VOLTAGE CAPABILITY

[75] Inventor: Hiromichi Kuwano, Tokyo, Japan
[73] Assignee: Texas Instruments Incorporated, Dallas, Tex.
[21] Appl. No.: 303,979
[22] Filed: Jan. 31, 1989

Related U.S. Application Data

[63] Continuation of Ser. No. 55,103, May 28, 1987, abandoned.

[30] Foreign Application Priority Data

Jun. 9, 1986 [JP] Japan .................................. 61-134501

[51] Int. Cl.[4] ...................... H01L 27/02; H01L 29/80; H01L 29/72
[52] U.S. Cl. ........................................ 357/43; 357/22; 357/35; 357/36; 357/37; 357/38; 357/41; 357/46
[58] Field of Search .................... 357/43, 38, 46, 41, 357/37, 35, 36, 38 L, 38 E, 22 E, 22 F, 22 V, 22 G, 22 H

[56] References Cited

U.S. PATENT DOCUMENTS

| | | | |
|---|---|---|---|
| 3,564,356 | 2/1971 | Wilson | 317/235 |
| 3,812,405 | 5/1974 | Clark | 317/235 AB |
| 4,160,988 | 7/1979 | Russell | 357/38 |
| 4,529,998 | 7/1985 | Lade et al. | 357/46 |
| 4,635,087 | 1/1987 | Birrittella et al. | 357/38 |

FOREIGN PATENT DOCUMENTS 60-245162  12/1985  Japan .................................. 357/46

OTHER PUBLICATIONS

*IEEE Trans. ELec. Dev.*, vol. ED-29, no. 2, 2/82, pp. 341-343 T. E. Zipperian, et al.
IEEE Intnatl Solid-State Circuit Conf., vol. 24, 2/81, pp. 40-41 Werner, et al.

Primary Examiner—Andrew J. James
Assistant Examiner—Ngan Van Ngo
Attorney, Agent, or Firm—William E. Hiller; N. Rhys Merrett; Mel Sharp

[57] ABSTRACT

A semiconductor device is primarily composed of a semiconductor substrate of a first conductivity type and a semidonductor layer of a second conductivity type formed in a principal plane of the semiconductor substrate. The device has both a bipolar transistor with the semiconductor layer itself being the collector region. The base region is of the first conductivity type and the emitter region is of the second conductivity type. Both regions are formed in the same layer as a JFET struture which includes the above collector region as channel a and the above base region as a gate. A semiconductor region of the first conductivity type is formed in the above semiconductor layer, the semiconductor layer itself, and the above base and emitter regions constitute a thyristor structure.

6 Claims, 3 Drawing Sheets

SEMICONDUCTOR INTEGRATED CIRCUIT WITH SWITCHING BIPOLAR TRANSISTORS HAVING HIGH WITHSTAND VOLTAGE CAPABILITY

This application is a continuation, of application Ser. No. 055,103, filed May 28, 1987, abandoned.

BACKGROUND OF THE INVENTION

1. Field of the Invention

The present invention relates to a semiconductor device that includes a transistor, JFET, and thyristor, more particularly to a monolithic IC (Integrated circuit) with built-in high withstand voltage switching elements.

2. Description of the Prior Art

Many bipolar IC semiconductor devices are fabricated in an epitaxial layer grown in a surface of a semiconductor substrate. This epitaxial layer is reverse in conductivity type to the substrate, with a pn junction electrically isolating the epitaxial layer and substrate from each other. In the epitaxial layer, isolation walls of the same conductivity type as the substrate and/or isolation regions are comprised of an insulating substance and are provided to form individual circuit element regions and wells electrically isolated from the surrounding areas. Since each well is electrically isolated by a pn junction or the like at the bottom of the well (interface between the epitaxial layer and substrate) and at the side walls, the emitter, base and collector electrodes of a bipolar junction transistor are all fabricated at the top of the well (the surface of epitaxial layer). With such electrode layout and as carriers flow from the emitter to the collector these carriers necessarily move in a horizontal direction (parallel to the surface of epitaxial layer). If the well is formed as a region of high resistivity with a low impurity concentration is provided in the horizontal direction, therefore, the collector series resistance, etc. becomes high. Such high collector series resistance results in an increase in the RC time constant, lowering the response speed of the transistor. For this reason, many bipolar ICs are designed so that each well used for the fabrication of a transistor has an embedded region of high impurity concentration (subcollector region) in the surface of the substrate or in proximity to the interface between the substrate and epitaxial layer, which is of the same conductivity type as the epitaxial layer and electrically continuous to such layer. The above subcollector region of high impurity concentration (low conductivity) spreads in the horizontal direction in the well, substantially reducing the resistivity of the well in such direction and thereby allowing a faster response, etc. of the transistor.

For the bipolar junction transistor with such embedded subcollector region, however, the emitter-collector withstand voltage is determined by the base-collector withstand voltage, namely, primarily by the impurity concentration and thickness (base-subcollector distance) of an epitaxial region sandwiched between the base region and the subcollector region below the emitter region. The configuration (for example, the curvature) of the base region also affects the withstand voltage.

In a silicon region doped with impurities at a concentration of $10^{18}$ cm$^{-3}$ or under, the breakdown that occurs there is primarily of the avalanche type. As the factor of causing the avalanche breakdown, a critical electrical field intensity, say, $10^5$ to $10^6$ V/cm is ordinarily assumed. As such critical electric field intensity is exceeded at some point in a transistor, there occurs a breakdown. Accordingly, to achieve a high withstand voltage, a large potential drop must be attained without exceeding the critical electric field intensity. For this end, it is effective to reduce the impurity concentration in the region of epitaxial layer between the base and subcollector regions and increase the thickness of such layer. However, thicker growth of the epitaxial layer of low impurity concentration has difficulties in the process control, etc. and tends to decrease the production yield. Further, since the epitaxial layer is ordinarily formed to a uniform thickness in the semiconductor wafer, the thickness of epitaxial layer increases also in other regions. Beside, it then becomes necessary to increase the depth and width of isolation walls. The above method will thus lead to a lower circuit integration by a more complicated process. For this reason, the thickness of epitaxial layer is limited. As a result, bipolar transistors that have been fabricated for practical applications have withstand voltages of up to about 60 V.

In view of the above circumstances, the proposed a high withstand voltage semiconductor device solves the problems mentioned above. The proposed semiconductor device has bipolar transistors fabricated as mentioned above and is characterized by the selection of the impurity concentration in the epitaxial layer (collector region) and the distance between the substrate and base region such as the collector voltage increases with a low level of signal voltage applied to the base region, the depletion layers extending from the semiconductor substrate and base region, respectively, grow in size large enough to cause the pinch-off condition before there appears any breakdown between collector and emitter regions. FIG. 1 is an example of such semiconductor device (in individual semiconductor regions, hatching of cross-sectional areas is omitted for easier understanding; the same applies to drawings hereinafter referred to). Referring to the switching npn bipolar transistor BTr of the above example, the embedded region of low resistivity as mentioned above is omitted with the n$^-$ inner collector region 21 sandwiched between the p base region 3 and p$^-$ substrate 1. The inner collector region 21 is set to such impurity concentration n$^-$ and thickness t that, as a voltage higher than a given level Vc is applied to the collector 21, the depletion layers 20 and 22 extend from the base region 3 and substrate 1, respectively, and come in contact as shown. Assuming that both the base region 3 and substrate 1 are grounded, the above requirement can be satisfied only if the width Wd of both depletion layers roughly conforms to the following inequality:

$$W_d \approx \sqrt{\frac{2 K_s \cdot \epsilon_0}{q \cdot N} V_c} \approx \sqrt{\frac{K_s \cdot V_c}{n}} \times 10^{14} \; (\mu m) > \frac{t}{2}$$

where $\epsilon_o$ is the dielectric constant of vacuum, Ks the relative dielectric constant, q the charge on the electron, and n the impurity concentration. In case of silicon (Ks$\approx$12), assuming n=$10^{15}$ cm$^{-3}$ and t=6 $\mu$m, therefore, the voltage Vc required to bring the depletion layers in contact is about 8 V. With n=$10^{16}$ cm$^{-3}$ and the same t, the depletion layers come in contact at Vc$\approx$50 V.

The depletion layer is, in other words, a region where there is a potential gradient. As a continuous depletion layer is formed between the inner collector region 21 underlying the base region 3 and the collector's charge collection region 5 (this corresponds to the drain of JFET), therefore, the highest potential in the inner collector region 21 is naturally lower than the potential in the collector's charge collection region 5. Accordingly, the sum of the voltage of inner collector region 21 and the voltage drop from such inner collector region 21 to the collector's charge collection region 5 is the collector voltage of this compound transistor. Even when the voltage of the inner collector region 21 is limited to around the ordinary level, a high potential drop in the depletion layer gives a high collector voltage. This means that the application of a high voltage to the collector, namely, region 5, will cause no avalanche breakdown below the emitter region.

It is noted that if the distance "Wc" between the base region 3 and collector's charge collection region 5 or the distance "d" between the collector's charge collection region 5 and substrate 1 is short, the avalanche breakdown occurs readily there. Accordingly, Wc must not be less than t/2. The proper values of Wc and d can be estimated from the desirable withstand voltage. In FIG. 1, the p+ isolation walls 23, surface oxide film 24, emitter electrode 25, base electrode 26, collector electrode 27 and field electrode 28 are fabricated.

Adjustments of the specific resistance of epitaxial layer 2 to about 3 ohm-cm ($n^- \approx 1.5 \times 10^{15}$ cm$^{-3}$), the distance t between the base region 3 and substrate 1 to approx. 7 $\mu$m, and the base diffusion depth to approx. 1.6 $\mu$m (surface concentration of approx. $10^{18}$ cm$^{-3}$ and base width of approx. 5 $\mu$m at surface) were found to give a base-collector withstand voltage BVceo higher than 210 V. This is a substantial improvement when compared to a BVcbo around 60 V achieved by the prior art. Horizontally aligned subregions of emitter region 4, base region 3, collector regions 2, 5, subregions which are primarily involved in determination of the withstand voltage characteristics, do not practically constitute any bipolar transistor ($\beta < 0.1$), so BVceo$\approx$BVcbo. It is thus noted that an even larger difference is expected, when the comparison is made to the ordinary BVceo value.

The JFET that uses the above collector's charge collection region 5 for drain is, a bulk type FET cascaded to the above BTr. In this FET, the inner collector region 21 serves as the source while the substrate 1 and base region 3 constitute the gate. In such a FET, even when the drain voltage changes, the source is not affected much, supplying almost a constant current. After the depletion layers join to establish the pinch-off condition, the potential of the inner collector region 21 is not much affected by changes in the collector voltage Vc. The channel length of the above pseudo-FET can be assumed to be the distance between the aforementioned emitter-base and base-collector junctions (hereinafter abbreviated EB and BC junctions, respectively) in the horizontal direction. In the above example, the channel length was larger than 5 $\mu$m. The primary factor of causing the avalanche breakdown is the relation between the p base (gate) region 3 (or the p$^-$ substrate 1) and n$^-$ epitaxial layer 2. With the ordinary impurity concentration and the ratio of p/n$^-$ being higher than 100, the withstand voltage is primarily determined both by the impurity concentration of epitaxial layer 2 and the length of horizontal region between the base region 3 and collector's charge collection region 5.

In the compound transistor of FIG. 1 the bulk JFET and BTr are fabricated in cascaded connection in such a manner that the pinch-off voltage Vp of the former is lower than the BVceo and is characterized by a high withstand voltage greater than 200 V. However, further studies revealed such a weak point of the above compound transistor and the omission of the aforementioned embedded region of low resistivity increases the on for saturation voltage.

OBJECTS AND SUMMARY OF THE INVENTION

Accordingly, it is an object of the invention to provide a semiconductor device that can achieve a high withstand voltage and yet assures a low on resistance and stable performances.

Namely, the invention relates to a semiconductor device primarily composed of a semiconductor substrate of a first conductivity type and a semiconductor layer of a second conductivity type formed in a principal plane of the semiconductor substrate and having both a bipolar transistor structure within such layer itself as a collector region and with the base region being of the first conductivity type and the emitter region being of the second conductivity type. Both regions being formed in the above collector region as a JFET with the above collector region including a channel and the above base region is a gate wherein the semiconductor region of the first conductivity type is formed in the above semiconductor layer. Such semiconductor layer itself, the above base and emitter regions constitute a thyristor structure.

Other objects, features and advantages of the invention will appear more fully from the following detailed description thereof taken in connection with the accompanying drawings.

BRIEF DESCRIPTION OF THE DRAWINGS

Namely, FIG. 2 is a cross-section of a high withstand voltage switching component of the invention with the corresponding circuit diagram added.

FIG. 3 is a plan view of FIG. 2 in which only the semiconductor regions are shown.

FIG. 4 is the output characteristic curves of the high withstand voltage switching component of FIG. 2.

FIG. 5 is the same cross-section as FIG. 2 in which a circuit is drawn to explain the parasitic effect.

FIG. 6 is an equivalent circuit of a monolithic IC having built-in switching components that are free from the parasitic effect.

FIGS. 7 and 8 are equivalent circuits, each illustrating an additional means to boost the collector potential.

DESCRIPTION OF THE PREFERRED EMBODIMENTS

The invention will be more clearly understood with reference to the following examples.

Figure 1:
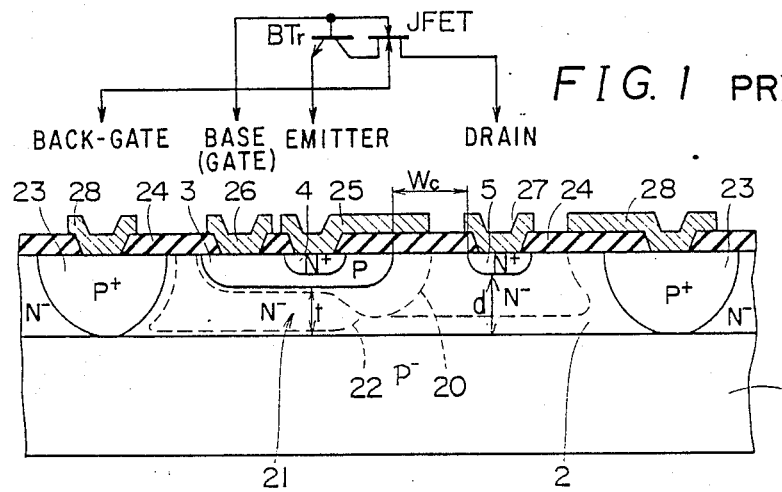
FIG. 1 is a cross-section of a high withstand voltage switching component of the prior art with the corresponding circuit diagram added.
Figure 2:
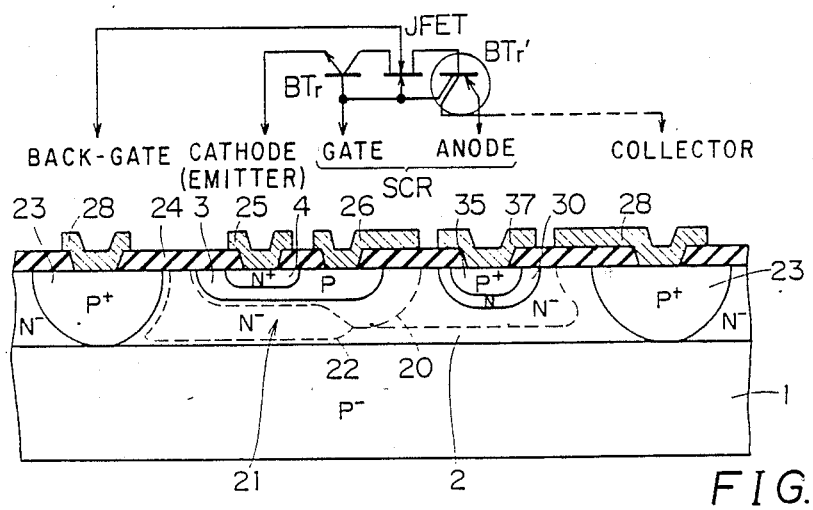
FIGS. 2 to 8 refer to examples of the present invention.
Figure 3:
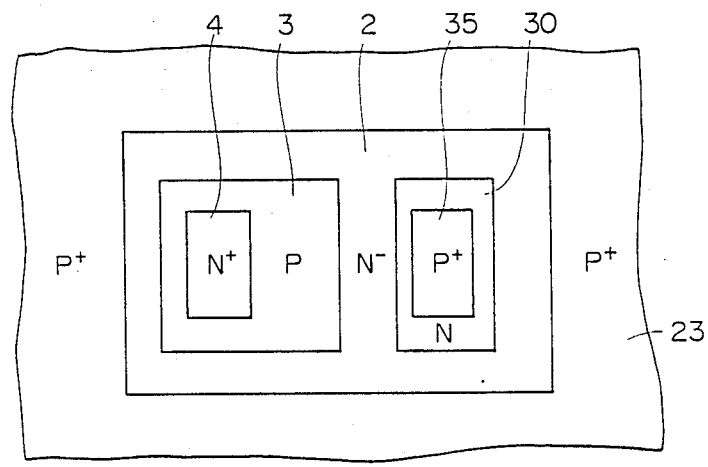

FIGS. 2 and 3 show a circuit part of a high withstand voltage monolithic IC embodying the invention. It is noted that in these figures regions common to the compound transistor shown in FIG. 1 are given the same numbers, of which explanation will be omitted.

Different from the prior art of FIG. 1, the semiconductor device of the invention has a diffused p+ semiconductor region 35 in a n typewell 30 formed in the n− epitaxial layer 2 instead of the n+ diffused region 5 as mentioned above that provides the drain. In addition to the aforementioned two circuit components, the npn bipolar transistor BT4 which is composed of the n+ emitter region 4, p base region 3 and n− collector region 21 and the n-channel JFET which is composed of the p base region 3 and the epitaxial layer 2 is the gate and channel, respectively. The newly added p+ region 35 forms a pnpn SCR (silicon controlled rectifier) together with the n− region 2 which includes the drain of the above JFET, p base region 3, and n+ emitter region 4 in a horizontal array. Namely, the p+ region 35, n+ region 4, and p region 3 provide the anode, cathode and gate, respectively, of a thyristor structure in parallel connection. It is noted that in the drawings the pnp bipolar transistor composed of the regions 35, 2 and 3 is marked "BTr'".

With such formation of a SCR (thyristor) structure through the bulk JFET, while the npn transistor BTr can withstand a higher voltage because of the bulk JFET for the same reason as already mentioned (the pinch-off of the FET occurs before the start of any breakdown between collector and emitter), the pnp transistor BTr' can also achieve a higher withstand voltage because the n well diffusion prevents the surface inversion. Another merit of the well diffusion is a high n type impurity concentration which limits the extension of the depletion layer 22 from the substrate 1 to suppress any punch-through between the substrate 1 and p+ region 35. Though a n+ embedded region (not shown), if formed, in the interface between the substrate 1 and epitaxial layer 2 just below the p+ region 35 would achieved the same effect, the n well 30 alone without such embedded region can still give a satisfactory high withstand voltage. A design that omits formation of such embedded region could thus be used with the aim of reducing the steps of fabrication process.

In addition to the high withstand voltage characteristics as mentioned above, the semiconductor device of the invention is so designed that as the SCR turns on, minority carriers are injected from the emitter region to the base region both in the pnp transistor BTr' and npn transistor BTr. In the base region, the same number of carriers of opposite polarity appear to keep the region electrically neutral, exerting an effect to practically reduce the specific resistivity of that region (conductivity modulation). Since the base region of the pnp transistor is the channel region of bulk JFET, the channel resistance substantially declines in the above turn-on state. This is very preferable because of a lower on resistance. Further, in the turn-off state, the epitaxial layer 2 has a specific resistance high enough to positively cause the pinch-off at a voltage lower than the withstand voltage of npn transistor BTr, always assuring the high withstand voltage characteristic as mentioned above.

Figure 4:
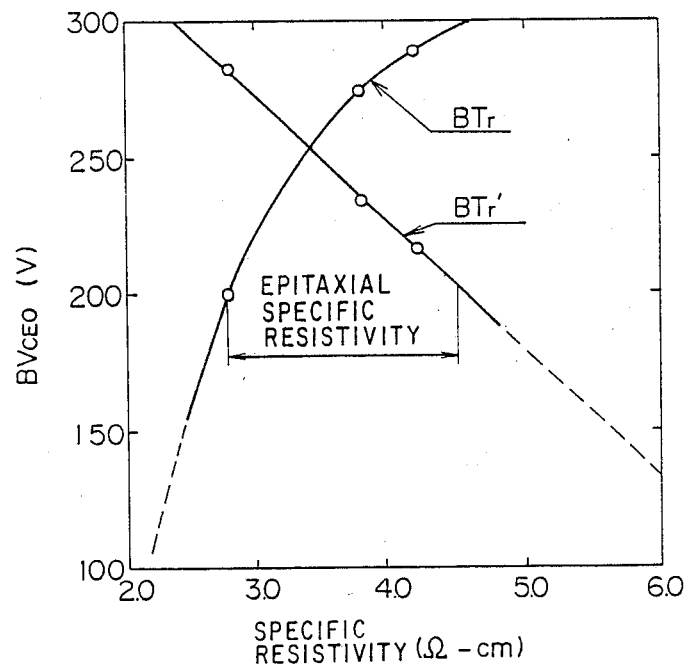

FIG. 4 is a diagram of the actually plotted characteristic withstand voltage curves, which show dependency of the breakdown voltages (the ordinate) of individual transistors BTr and BTr' on the condition of the epitaxial layer, namely, the specific resistance of epitaxial layer (the abscissa). From such curves, the preferable range of the specific resistance (namely i.e., the impurity concentration, etc. of epitaxial layer can be estimated.

It is noted that in the present example the base electrode 26 of BTr is disposed over and between the anode and cathode of a SCR covering a pn junction thereunder to stabilize the base potential while the field plate 28 is formed to cover another pn junction that suppresses the breakdown in the surface of epitaxial layer.

Figure 5:
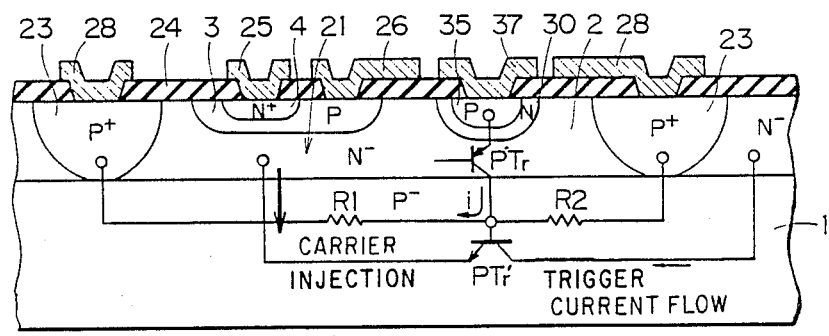
Figure 6:
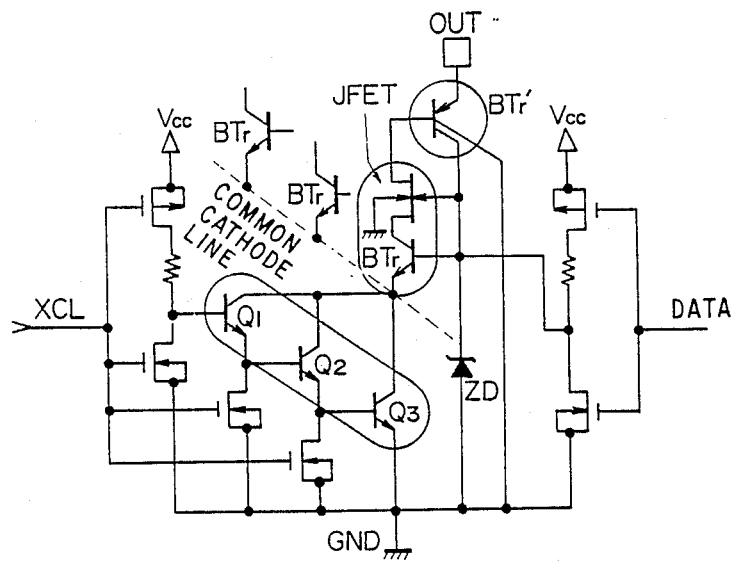

FIGS. 5 and 6 refer to another example of semiconductor device embodying the invention.

The first example of a semiconductor device having further improvements are examined since there was no practical example of a large current SCR fabricated on a monolithic IC substrate, the fabrication of such SCR structure leaves problems in the practical applications. Particularly, referring to FIG. 5, a large current partially flows into the substrate 1 as current i through a parasitic pnp transistor PTr composed of the p region 35, n region 2 and substrate 1 to boost the potential of the substrate. If this occurs, another parasitic transistor PTr' that comprises the n region whose potential is close to the substrate (namely, the collector region of the npn transistor of the SCR) is forward biased to cause injection of minority carriers, presenting a possibility that the parasitic SCR confined within the isolation walls 23 and/or other SCR beyond such isolation walls may be accidentally turned on.

As mentioned above, actually, the SCR is often difficult to turn off. In this example, to avoid such difficulty, a circuit diagram of FIG. 6 is used to positively turn on and off the SCR.

In order to prevent the SCR from being accidentally turned on, it is necessary to have the potential of substrate 1 higher than the collector region (n type) of the npn transistor of the SCR. to raise the potential of the SCR's cathode (the aforementioned region 4) and to boost the potential of the above collector, a single Darlington circuit composed of transistors Q1, Q2 and Q3 is connected to the cathodes of all the SCRs. When turning off the thyristor, the BTr must be turned off. Therefore, a Zener diode Zd is used to clamp the base potential to the Zener voltage $V_{ZD}$. Then, as Q1, Q2 and Q3 are turned off at such clamped state, the transistor BTr comprising the thyristor switches off.

With the above transistors Q1, Q2 and Q3 in the Darlington connection on, the potential common to the collectors of these transistors is the cathode potential of the SCR. This cathode potential Vk is the sum of the saturation potential of Q1, voltages between base and emitter of Q2 and Q3, namely, $$Vk = V_{CE} = V_{CEsat(Q1)} + V_{BE(Q2)} + V_{BE(Q3)}.$$

There may appear a bias of about 1.3 V. The substrate 1 can then never be forward biased to the n region 2 (or 22), so the carrier injection as mentioned above that may cause malfunction of other SCRs can be avoided.

These transistors Q1, Q2 and Q3 in the Darlington connection also have function of assuring positive turn off of the SCR that is otherwise difficult to turn off. Namely, the transistors Q1 to Q3 switch on with the SCR (the transistors may be turned on earlier or later). When turning off the SCR, the voltage that is applied to the gate of the SCR vanishes but the transistors Q1 to Q3 switch off and stop the collector current of the npn transistor of the SCR (cutoff of the on current) and thereby positively turns off the SCR.

The semiconductor device of the present example can actually achieve 500 mA at 4 V per unit gate 25 μm wide. A large output current density 50 times as high as the prior art can thus be attained with a substantial reduction in the on resistance. Further, the area per circuit component is also substantially reduced. For example, even an area 1/30 times as small as the conventional design provides satisfactory performances.

Figure 7:
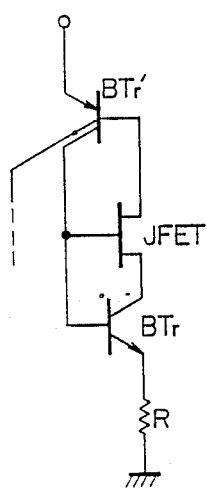
Figure 8:
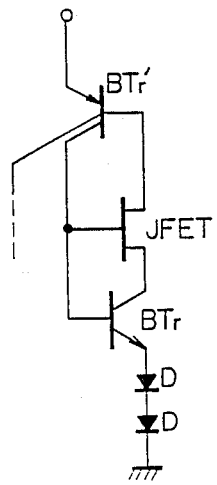

If turning off of the SCR as mentioned above is not particularly aimed at with the primary purpose being to suppress the parasitic effect as mentioned above, a resistor "R" or diode "D" may be connected as shown in FIGS. 7 or 8, respectively, to boost the cathode potential. Such resistor or diode may have a rather lower withstand voltage.

It will be evident that various modifications can be made to the described embodiments without departing from the scope of the present invention.

For example, in the above examples, it is not always necessary to provide the n well 30. Even when such well 30 is omitted, however, other semiconductor regions may be fabricated almost in conformity to the example of FIG. 1 with respect to the configuration, size, impurity concentration, etc. Further, the above example may be reversed in conductivity types of individual semiconductor regions. It is noted that the semiconductor device of the invention will find various applications as a high withstand voltage switching device. For example, the device may be widely used as the display driver.

In the invention, as mentioned above, a bipolar transistor is fabricated in the semiconductor layer formed on a substrate in such a manner that the collector and base regions thereof constitute the channel and gate of a JFET structure while a semiconductor region of the first conductivity type formed in the above semiconductor layer, the above semiconductor layer itself, the base and emitter regions of the above bipolar transistor constitute a thyristor structure. The above bipolar transistor can thus be fabricated for a high withstand voltage characteristic since the above JFET is pinched off to prevent any breakdown between the collector and emitter regions.

Further, as the above thyristor structure is turned on, minority carriers are injected from the emitter region into the base region in individual transistors comprising this thyristor structure, when in the base region of one of these transistors (namely, the region corresponding to the channel of the above JFET) an equivalent number of majority carriers are generated to maintain the electrical neutrality. These majority carriers substantially reduce the specific resistance of base region (namely, the channel) to lower the on resistance of the thyristor.

What is claimed is:

1. An integrated circuit semiconductor structure providing a first vertical bipolar transistor and a second lateral bipolar transistor connected in a thyristor configuration with a JFET, said integrated circuit semiconductor structure comprising:
   semiconductor substrate means including a semiconductor body portion of a first conductivity type and a semiconductor layer portion of a second conductivity type disposed on said semiconductor body portion, a PN junction defined between said semiconductor body portion of said first conductivity type and said semiconductor layer portion of said second conductivity type electrically isolating said semiconductor layer portion of said second conductivity type from said semiconductor body portion of said first conductivity type;
   a first dopant region of said first conductivity type disposed in said semiconductor layer portion of said second conductivity type and opening onto the surface thereof;
   a second dopant region of said second conductivity type disposed within said first dopant region of said first conductivity type and opening onto the surface of said first dopant region;
   a third dopant region of said second conductivity type disposed in said semiconductor layer portion of said second conductivity type and having a higher dopant concentration in relation thereto, said third dopant region of said second conductivity type onto the surface of said semiconductor layer portion of said second conductivity type and disposed in laterally spaced relationship with respect to said first dopant region of said first conductivity type;
   a fourth dopant region of said first conductivity type disposed within said third dopant region of said second conductivity type and opening onto the surface of said third dopant region;
   said first dopant region and said second dopant region defining the base region and the emitter region respectively with the underlying area of said semiconductor layer portion defining the collector region of said first vertical bipolar transistor;
   said base region and said collector region of said first vertical bipolar transistor respectively defining a gate and a channel of said JFET;
   said fourth dopant region of said first conductivity type cooperating with said semiconductor layer portion of said second conductivity type and said first dopant region of said first conductivity type in respectively defining the emitter, base and collector regions of said second lateral bipolar transistor connected in the thyristor configuration to said first vertical bipolar transistor through said JFET; and
   set JFET enabling said first vertical bipolar transistor to withstand a higher voltage signal by achieving a pinch-off condition before the onset of voltage breakdown between the collector and emitter regions of said first vertical bipolar transistor, and said second lateral bipolar transistor having the capability of achieving a higher withstand voltage due to the prevention of surface inversion by said third dopant region of said second conductivity type.

2. An integrated circuit semiconductor structure as set forth in claim 1 wherein said fourth dopant region of said second lateral bipolar transistor forms the anode, said second dopant region of said second conductivity type providing the emitter region of said first vertical bipolar transistor forms the cathode, and said first dopant region of said first conductivity type defining the base region of said first vertical bipolar transistor and the collector region of said second lateral bipolar transistor forms the gate of said thyristor configuration.

3. An integrated circuit semiconductor structure as set forth in claim 1 wherein said thyristor configuration is disposed in parallel with said JFET.

4. An integrated circuit semiconductor structure as set forth in claim 2 wherein said thyristor configuration further includes circuit means operably connected to said second dopant region providing said emitter region of said first vertical bipolar transistor and forming said cathode of said thyristor configuration to boost the potential of said cathode.

5. An integrated circuit semiconductor structure as set forth in claim 4 wherein said circuit means comprises a plurality of transistors in Darlington connection with the collector of each of said plurality of transistors being commonly connected to said cathode of said thyristor configuration.

6. An integrated circuit semiconductor structure as set forth in claim 1 further including a fifth dopant region of said first conductivity type disposed in said semiconductor layer portion of said second conductivity type and extending into said semiconductor body portion of said first conductivity type, said fifth dopant region of said first conductivity type opening onto the surface of said semiconductor layer portion of said second conductivity type and bounding said first vertical bipolar transistor, said second lateral bipolar transistor and said JFET to define an electrically isolating wall;

a base electrode disposed on said first dopant region of said first conductivity type defining said base region of said first vertical bipolar transistor and said collector region of said second lateral bipolar transistor; and a field electrode disposed on said fifth dopant region of said first conductivity type defining said electrically isolating wall.

* * * * *